United States Patent [19]

Richards et al.

[11] Patent Number: 5,439,706

[45] Date of Patent: * Aug. 8, 1995

[54] METHOD FOR MANUFACTURING INORGANIC MEMBRANES BY ORGANOMETALLIC CHEMICAL VAPOR DEPOSITION

[75] Inventors: Robin E. Richards, Chalfont; Robert L. Iampietro, Emmaus; Paul N. Dyer, Allentown, all of Pa.

[73] Assignee: Air Products and Chemicals, Inc., Allentown, Pa.

[ * ] Notice: The portion of the term of this patent subsequent to Nov. 1, 2011 has been disclaimed.

[21] Appl. No.: 214,920

[22] Filed: Mar. 17, 1994

Related U.S. Application Data

[63] Continuation of Ser. No. 816,195, Jan. 2, 1992, Pat. No. 5,360,635.

[51] Int. Cl.$^6$ .................................................. B05D 5/00
[52] U.S. Cl. ........................... 427/244; 427/245; 427/255; 427/255.3; 427/376.2
[58] Field of Search ............ 427/242, 244, 245, 255.3, 427/255, 376.2

[56] References Cited

U.S. PATENT DOCUMENTS

| | | | |
|---|---|---|---|
| 4,330,633 | 5/1982 | Yoshisato et al. | 501/152 |
| 4,505,985 | 3/1985 | Schmidt et al. | 427/255.3 |
| 5,035,727 | 7/1991 | Chen | 55/16 |
| 5,106,654 | 4/1991 | Isenberg | 427/255.3 |
| 5,140,003 | 8/1992 | Mueller | 427/255.2 |

FOREIGN PATENT DOCUMENTS

61-21717  1/1986  Japan.

OTHER PUBLICATIONS

Teraoka and coworkers, Nippon Seramikkusu Kyobai Gabujutsu Ronbushi 97 (1989) 533.

*Primary Examiner*—Janyce Bell
*Attorney, Agent, or Firm*—Keith D. Gourley

[57] ABSTRACT

The present invention is a method for manufacturing inorganic membranes which are capable of separating oxygen from air. The membranes comprise a thin layer of a multicomponent metallic oxide which has been deposited onto a porous substrate by organometallic chemical vapor deposition. The inorganic membranes are formed by reacting organometallic complexes corresponding to each of the respective metals making up the multicomponent metallic oxide and an oxidizing agent under conditions sufficient to deposit a thin layer of the multicomponent metallic oxide onto the porous substrate.

11 Claims, 1 Drawing Sheet

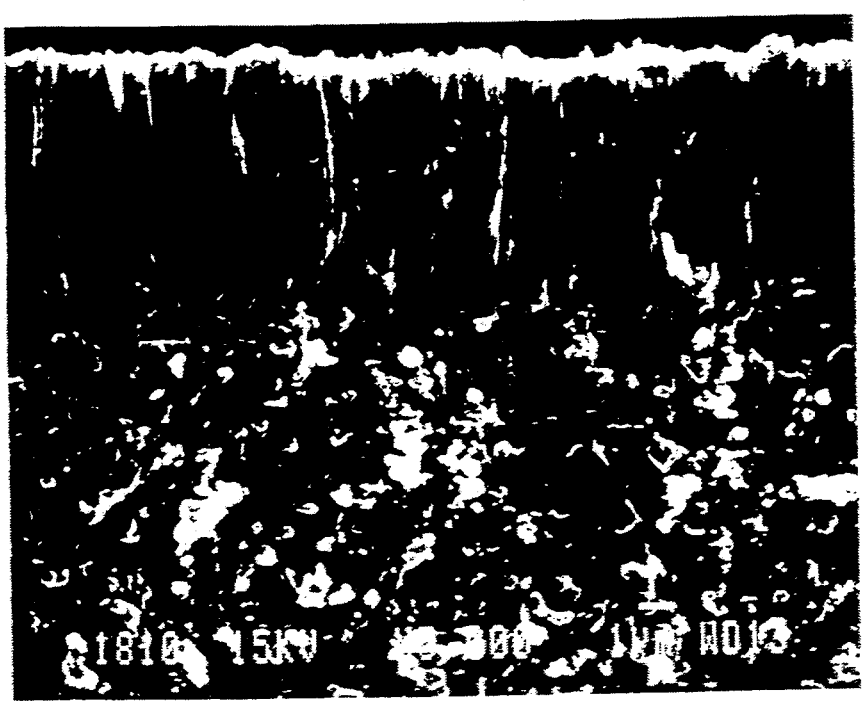

METHOD FOR MANUFACTURING INORGANIC MEMBRANES BY ORGANOMETALLIC CHEMICAL VAPOR DEPOSITION

This is a continuation of application Ser. No. 07/816,195 filed Jan. 2, 1992, now U.S. Pat. No. 5,360,635 the Specification which is incorporated by reference herein.

TECHNICAL FIELD OF THE INVENTION

The present invention is a method for manufacturing inorganic membranes comprising a thin layer of a multicomponent metallic oxide which has been deposited onto a porous substrate by organometallic chemical vapor deposition (OMCVD).

BACKGROUND OF THE INVENTION

Oxygen is required in increasingly greater quantities in industrial combustion and oxidation processes. Oxygen is typically separated from air by processes such as cryogenic distillation, adsorptive separation, chemical absorption and differential permeation through membrane media. Solid electrolyte membranes (SEMs) are currently being studied as an alternative technology for separating oxygen from oxygen-containing gaseous mixtures such as air. The most promising SEMs are formed from multicomponent metallic oxides such as titania-doped yttria-stabilized zirconia (YSZ) and praseodymia-modified zirconia.

Gas separation membranes formed from multicomponent metallic oxides are typically operated at high temperatures (e.g. 800° C. or more) wherein the membranes conduct both oxygen ions and electrons and can thereby operate without the encumbrance of external circuitry such as electrodes, interconnects and power supplies. When a difference in oxygen partial pressure exists on opposite sides of the multicomponent metallic oxide membrane and operating conditions are properly controlled, pure oxygen is produced as oxygen ions migrate to the low pressure side of the membrane while an electron flux occurs in the opposite direction in order to conserve charge.

Several laboratories are investigating methods for preparing multicomponent metallic oxides suitable for use as inorganic membranes. However, currently available preparative methods are not totally satisfactory. For example, stoichiometry of the multicomponent metallic oxide is sometimes difficult to control and detrimental chemical reactions sometimes occur between the multicomponent metallic oxide and the substrate due to the high temperatures required to form the required layer.

Prior art methods for making multicomponent metallic oxides include U.S. Pat. No. 4,330,663 which discloses SEMs formed from a sintered body of a multicomponent metallic oxide comprising an oxide of cobalt, an oxide of at least one metal selected from strontium and lanthanum and an oxide of at least one metal selected from bismuth and cerium. The multicomponent metallic oxides are prepared by a time-consuming method wherein lanthanum oxide, bismuth oxide and cobalt acetate are ground, fired at high temperatures, reground and sintered.

Japanese Patent Application No. 61-21717 discloses SEMs which are formed from multicomponent metallic oxides represented by the formula $La_{1-x}Sr_xCo_{1-y}Fe_yO_{3-d}$ wherein x ranges from 0.1 to 1.0, y ranges from 0.05 to 1.0 and d ranges from 0.5 to 0. The mixed oxides are prepared by heating a mixture of hydroxide precipitates formed by adding an alkaline solution such as ammonia water or caustic alkali to a solution of the metal salts. The mixture is heated at a temperature between 650° C. and 1400° C., preferably between 850° and 1260° C., for a few hours or dozens of hours depending on the temperature, and then sintered at temperatures between 1000° C. and 1500° C., preferably between 1150° and 1350° C.

Teraoka and coworkers, Nippon Seramikkusu Kyobai Gabujutsu Ronbushi, 97 (1989) 533 disclose various methods for depositing a thin $La_{0.6}Sr_{0.4}CoO_3$ perovskite multicomponent metallic oxide layer onto a porous support of the same material by an rf sputtering technique and a liquid suspension spray deposition method. The film produced by the rf sputtering method was cracked and porous. While the liquid suspension spray deposition technique produced a film approximately 15 $\mu m$ thick following sintering at 1400° C. and repeated deposition/sintering cycles, the film showed unexpectedly low oxygen permeability due in part to the extremely high temperatures required to produce the desired non-porous morphology.

A need in the art exists for an improved method for depositing a layer of a substantially single phase multicomponent metallic oxide onto a porous support which overcomes the above-mentioned limitations. Desirably, such a method would enable a layer of a multicomponent metallic oxide to be deposited onto a porous substrate at lower temperatures than previously possible in order to promote formation of low stress coatings, to reduce chemical reactions between the multicomponent metallic oxide layer and porous substrate and to minimize changes in the substrate microstructure caused by heating the material at unduly high temperatures.

BRIEF SUMMARY OF THE INVENTION

The present invention is a method for manufacturing inorganic membranes which are capable of separating oxygen from oxygen-containing gaseous mixtures. The membranes comprise a thin layer of a multicomponent metallic oxide which has been deposited by organometallic vapor deposition (OMCVD) onto a porous substrate. Organometallic complexes corresponding to each of the respective metals making up the desired multicomponent metallic oxide to be formed are reacted with an oxidizing agent under conditions sufficient to deposit a thin multicomponent metallic oxide layer onto the porous substrate.

More particularly, the OMCVD method comprises (a) individually heating organometallic complexes capable of forming the desired multicomponent metallic oxide to a temperature sufficient to vaporize each respective organometallic complex; (b) introducing the vaporous organometallic complexes and an oxidizing agent into a reactor containing a porous substrate to form a mixture of the vaporous organometallic complexes and the oxidizing agent and (c) depositing a layer of the multicomponent metallic oxide onto the porous substrate by reacting the mixture of organometallic complexes and oxidizing agent at a temperature and pressure sufficient to form the inorganic membrane. Optionally, the method for manufacturing inorganic membranes further comprises (d) heat treating the layer of multicomponent metallic oxide at a temperature and for a time period sufficient to eliminate any through porosity within the multicomponent metallic layer.

Multicomponent metallic oxides suitable for practicing the method comprises an oxide of at least two different metals or a mixture of at least two metal oxides wherein the material demonstrates oxide ion conductivity when heated to an elevated temperature. A preferred type of multicomponent metallic oxide comprises a mixed conducting oxide which comprises an oxide of at least two different metals or a mixture of at least two different metal oxides wherein the mixed conducting oxide demonstrates electron conductivity as well as oxide ion conductivity at elevated temperature.

In an alternate embodiment the method is capable of depositing a layer of a multicomponent metallic oxide containing a Group 2 metal. Suitable Group 2 metals are selected from the group consisting of calcium, strontium, barium and magnesium. In a preferred embodiment, the present method is particularly suited toward depositing a mixed conducting oxide represented by the structure $A_xA'_{x'}A''_{x''}B_yB'_{y'}B''_{y''}O_{3-z}$, where A,A',A'' are chosen from the group comprising Groups 1, 2 and 3 and the F block lanthanides; and B,B',B'' are chosen from the D block transition metals according to the Periodic Fable of the Elements adopted by the IUPAC wherein $0<x\leq 1$, $0\leq x'\leq 1$, $0\leq x''\leq 1$, $0<y\leq 1$, $0\leq y'\leq 1$, $0\leq y''\leq 1$, $x+x'+x''=1$, $y+y'+y''=1$ and z is a number which renders the compound charge neutral. Preferred mixed conducting oxides which can be deposited are represented by the formula $La_xA_{1-x}Co_yFe_{1-y}O_{3-z}$ wherein x is between 0 and 1, y is between 0 and 1 and A is selected from barium, strontium or calcium.

The method according to the present invention provides numerous advantages over prior art methods for forming inorganic membranes comprising multicomponent metallic oxides. The instant OMCVD method produces uniform, conformal layers of a multicomponent metallic oxide which can be deposited onto a complex porous support structure. Direct low temperature deposition promotes low stress coatings and minimizes chemical interactions between the porous substrate and the multicomponent metallic oxide coating. Moreover, the present method produces a layer of multicomponent metallic oxide which readily densities at low temperatures, ca. 800° C., to form a multicomponent metallic oxide layer which is free of through-porosity.

BRIEF DESCRIPTION OF THE FIGURE

The sole FIGURE is an scanning electron micrograph of a inorganic membrane comprising a (La, Ba)(Co, Fe)$O_{3-z}$ thin film which has been deposited onto a multicomponent metallic oxide support.

DETAILED DESCRIPTION OF THE INVENTION

The present invention is a method for manufacturing inorganic membranes which are capable of producing pure oxygen, enriching the oxygen content of gaseous steams, extracting oxygen from oxygen-containing gaseous streams and functioning as an electrode material for use on the air pole side of high-temperature solid electrolyte fuel cells. The inorganic membranes of the present invention comprise a layer of a multicomponent metallic oxide which is deposited by organometallic chemical vapor deposition (OMCVD) onto a porous substrate. The present OMCVD method offers numerous advantages over prior art physical vapor deposition methods such as rf sputtering, and liquid suspension spray methods currently available for depositing a multicomponent oxide onto a substrate.

Multicomponent metallic oxides suitable for practicing the method comprise an oxide of at least two different metals or a mixture of at least two metal oxides wherein the material demonstrates oxide ion conductivity when heated to an elevated temperature. A preferred type of multicomponent metallic oxide comprises a mixed conducting oxide which comprises an oxide of at least two different metals or a mixture of at least two different metal oxides wherein the mixed conducting oxide demonstrates electron conductivity as well as oxide ion conductivity at elevated temperature. Electron conductivity denotes conductivity attributed to electrons and/or electron holes and oxide ion conductivity denotes conductivity attributed to oxide ions.

In an alternate embodiment the method is capable of depositing a layer of a multicomponent metallic oxide containing a Group 2 metal. Suitable Group 2 metals are selected from the group consisting of calcium, strontium, barium and magnesium. In a preferred embodiment, the present method is particularly suited toward depositing a mixed conducting oxide represented by the structure $A_xA'_{x'}A''_{x''}B_yB'_{y'}B''_{y''}O_{3-z}$, where A,A',A'' are chosen from the group comprising Groups 1, 2 and 3 and the F block lanthanides; and B,B',B'' are chosen from the D block transition metals according to the Periodic Table of the Elements adopted by the IUPAC wherein $0<x\leq 1$, $0\leq x'\leq 1$, $0\leq x''\leq 1$, $0<y\leq 1$, $0\leq y'\leq 1$, $0\leq y''\leq 1$, $x+x'+x''=1$, $y+y'+y''=1$ and z is a number which renders the compound charge neutral. Preferred mixed conducting oxides which can be deposited are represented by the formula $La_xA_{1-x}Co_yFe_{1-y}O_{3-z}$ wherein x is between 0 and 1, y is between 0 and 1 and A is selected from barium, strontium or calcium.

Suitable organometallic complexes comprise compounds having organic functionality and a metallic component which corresponds to the metal to be introduced into the multicomponent metallic oxide. Representative organometallic complexes include the metallic derivatives of the beta-diketone-, alkoxide- and cyclopentadiene-family of precursors which are commercially available and/or well known in the art. The multicomponent metallic oxide is formed by reacting the mixture of organometallic complexes and an oxidizing agent under reaction conditions sufficient to effect the conversion. Upon understanding the nature of the present invention, one of ordinary skill in the art can readily select organometallic complexes capable of reacting with the oxidizing agents to form the desired multicomponent metallic oxide.

A wide variety of porous substrates are capable of receiving the enumerated multicomponent metallic oxides. Such porous substrates possess a network of pores such that a gas can permeate through the substrate (i.e., through-porosity). Therefore, the term, porous substrate, does not refer to materials which merely possess surface or closed internal porosity. Suitable porous substrates include supports made of the same or similar composition as the layer to be deposited by the OMCVD method, an alternate multicomponent metallic oxide disclosed herein and conventional compatible porous substrates.

Conventional compatible porous substrates include metal oxide-stabilized zirconia such as yttria-stabilized zirconia and calcia-stabilized zirconia, alumina, magnesia, silica, titania, a high temperature oxygen compatible metal alloy, and compounds and mixtures thereof. Any combination of porous substrate and multicomponent metallic oxide can be utilized so long as their coefficients of thermal expansion are compatible and no adverse chemical reactions occur between the substrate and multicomponent metallic oxide at operating temperatures of the inorganic membrane.

The initial step in Applicants' method comprises individually heating organometallic complexes of at least two different metals capable of forming the desired multicomponent metallic oxide to a temperature sufficient to vaporize each respective organometallic complex. Any suitable method known in the art can be used to independently vaporize the organometallic complexes. For example, the organometallic complexes can be placed into a reactor comprising a plurality of beds situated in a multi-zone chamber under reduced pressure. The number of beds to be used is based on the number of organometallic complexes necessary to form the desired multicomponent metallic oxide. The organometallic complexes are then independently heated in separate beds to a temperature sufficient to create the desired vapor pressure of the respective complex. The beds can be heated by any conventional method including, but not limited to, resistance heating and induction heating.

The next step in the method comprises introducing a predetermined amount of the vaporous organometallic complexes into a reactor containing a porous substrate onto which the coating of multicomponent metallic oxides shall be deposited. In an alternate embodiment, the organometallic complexes can be transferred into the reactor by means of an inert carrier gas. Suitable inert gases include those which will not react with the organometallic complexes or porous substrate under the enumerated method conditions. Representative inert gases include argon, nitrogen and helium.

A predetermined amount of each organometallic complex is transferred into the reactor by heating each complex under controlled conditions based upon the carrier gas flowrate and the vapor pressure of each respective complex as a function of temperature. Suitable vaporizing temperatures are easily determined by those of ordinary skill in the art and will vary depending upon the desired vapor pressure of the organometallic complex, the desired growth rate and desired film thickness of the multicomponent metallic oxide to be deposited onto the porous substrate.

An oxidizing agent is also introduced into the reactor containing the mixture of vaporous organometallic complexes and the porous substrate. The amount of oxidizing agent to be supplied into the reactor may vary depending upon the particular organometallic complexes used, the ease of oxidation of the complexes and the like. Any conventional chemical vapor deposition reactor can be used to practice the method of this invention. Preferably, an amount of oxidizing agent is used so as to provide sufficient oxidation of the organometallic complexes to minimize formation of secondary phases. Suitable oxidizing agents include, but are not limited to, oxygen, ozone, air, $N_2O$ and a mixture of water and oxygen.

The mixture of organometallic complexes and oxidizing agent is then reacted at a temperature and pressure sufficient to deposit a layer of the desired multicomponent metallic oxide onto the porous substrate. Suitable reaction conditions for forming the multicomponent metallic oxides of this invention include a pressure ranging from 1 to 760 torr and a temperature ranging from about 400° to 800° C. Reaction conditions for forming the mixed conducting oxides defined by the formulae previously disclosed include a temperature ranging from about 450° to 600° C. and a pressure ranging from 2 to about 10 torr. Low temperature deposition avoids deleterious reactions of the deposited multicomponent metallic oxide film with the substrate which can adversely affect the ability of the membrane to separate oxygen from gaseous mixtures. The reaction is continued for a time period sufficient to deposit a layer of the multicomponent metallic oxide having a thickness ranging from 0.1 $\mu$m to about 50 $\mu$m, preferably from 0.1 $\mu$m to about 10 $\mu$m.

Optionally, the deposited multicomponent metallic oxides can be heat-treated at a temperature sufficient to eliminate any remaining through-porosity within the layer of multicomponent metallic oxide. More particularly, the inorganic membrane is heated to a temperature above the deposition temperature used to prepare the oxide layer. Heat treatment can be accomplished at a heating rate of 1° to 5° C./min to a temperature of 650° to 1100° C. for a period ranging from 10 minutes to 5 hours. Heat treatment may be carried out by utilizing direct heating with an electrical heater as well as indirect heating using a high temperature gas such as a high-temperature combustion gas.

In an alternate embodiment, the present invention can be adapted to deposit a multicomponent metallic oxide into the pores of the porous substrate. The method according to this embodiment comprises (a) independently heating at least two organometallic complexes capable of forming the desired multicomponent metallic oxide to temperatures sufficient to vaporize each of the organometallic complexes; (b) introducing the vaporized organometallic complexes into a first chamber of a reactor comprising two chambers which are connected by a removable porous substrate having a network of pores capable of transporting gases between the two chambers; (c) introducing an oxidizing agent into a second chamber of the reactor; (d) contacting the organometallic complexes and the oxidizing agent in the pores of the porous substrate at a temperature and a pressure sufficient to deposit plugs of the multicomponent metallic oxide within the pores of the substrate to form the inorganic membrane. The enumerated operating conditions are suitable for practicing this embodiment subject to utilizing a reactor adapted to practice this type of deposition. One suitable reactor design, among many designs known in the art, for practicing the OMCVD method for depositing the multicomponent metallic oxides into the pores of the porous substrate is presented in J. Europ. Ceramic Society 8 (1991) 59, the text which is incorporated by reference herein.

The following is a description of one suitable procedure for manufacturing the inorganic membranes of this invention. Each respective organometallic complex is loaded into a stainless steel bubbler (source), having an internal volume of approximately 55 cm$^3$, each fitted within a $\frac{3}{8}$ inch I.D. metal feed tube capped by a $\frac{1}{4}$ inch 10 $\mu$m pore size sparger. Each source is heated by a separate external heater and allowed to reach thermal equilibrium. An inert carrier gas such as nitrogen is passed through each bubbler in order to more readily transfer each complex into the OMCVD reactor. The inert carrier gas streams can be metered by mass flow controllers. The space velocity of the inert gas through each bubbler is controlled in the range 0.01 to 10 scc/cc/min, and, together with the source temperatures, are adjusted to achieve a dynamically stable and sufficient rate suitable for transferring each complex into the reactor.

Feed lines for transferring the organometallic complexes into the reactor are preferably heated to prevent condensation of the organometallic complex on the walls of the lines. The complexes and the desired oxidizing agent are added to provide the required total flow rate entering the OMCVD reactor. The organometallic complexes are passed over a heated substrate located in the OMCVD reactor. Suitable porous substrates include calcia (~5 wt.%) stabilized zirconia (CSZ) substrate discs (approximately 1.5 mm thick and 20 mm diameter machined from ceramic pieces obtained from Johnson Matthey), sections of 1.2 cm O.D. yttria-stabilized zirconia (YSZ) tube (ex Kyocera Corporation, Japan), and $La_{0.20}Sr_{0.80}Co_{0.80}Fe_{0.20}O_{3-z}$ discs (1 mm thick and 22 mm diameter), located in the OMCVD reactor.

As previously stated, an inert gas can be used to assist in transferring the organometallic complexes into the reactor. Reactor pressures ranging from 0.1 torr to atmospheric pressure may be utilized when an inert carrier gas is used to transport organometallic complexes from a source to the CVD reactor. However, the preferred operating pressure should be limited to about 70 torr due to safety considerations. However, this pressure limitation should not be viewed as limiting the scope of this invention because the apparatus can be readily adapted to practice at higher pressures. Typical vapor pressures generated by the organometallic complexes range from 0.01 to 1 Torr in the absence of an inert carrier gas. The enumerated substrates can be heated by conventional techniques.

OMCVD experiments have been performed within the temperature range of 450°–800° C. The lower temperature may be decreased to the minimum temperature at which the desired phase can be deposited at an acceptable deposition rate. Microwave plasma and uv irradiation can be utilized to facilitate lower temperature deposition of the multicomponent metallic oxide onto the porous support. The upper OMCVD reaction temperature is set to minimize deleterious chemical reactions between the deposited multicomponent metallic oxide and the porous substrate and to prevent sintering of the support layer.

Porous substrates having the structure $La_xA_{1-x}Co_yFe_{1-y}O_{3-z}$ (x,y=0–1, A=Ba or Sr) are known to undergo alterations in microstructure due to sintering at elevated temperatures greater than about 950° C., which impairs the ability of the membrane to transport gases. However, the present method overcomes the above-mentioned limitations. For example, a layer of a mixed conducting oxide represented by the formula $La_xA_{1-x}Co_yFe_{1-y}O_{3-z}$ (x,y=0–1, A=Ba or Sr), can be deposited onto a porous substrate of the same composition at a temperatures less than about 800° C. which avoids sintering densification of the substrate. Therefore, the membranes of the present invention possess superior gas flux compared to inorganic membranes formed by prior art methods.

Suitable organometallic complexes for forming the above-mentioned mixed conducting oxides include $(Ba)_4(thd)_8$, $La(thd)_3$, $Co(thd)_2$, and $Fe(thd)_3$. Suitable temperatures for vaporizing the same are 200°–250° C., 160°–200° C., 100°–140° C. and 100°–140° C. respectively. At the lower limits, the sources are below the organometallic complex melting points. The upper limits are well below the thermal decomposition temperatures of the melts which are greater than 300° C. as defined by differential scanning calorimetry. When preparing the above-mentioned multicomponent metallic oxides containing barium, $BaCO_3$ formation is not detected by XRD despite the thermodynamic stability of $BaCO_3$. The use of $(Ba)_4(thd)_8$ circumvents problems associated with other barium sources such as Ba(hfac)$_2$tetraglyme and provides a significant process advantages for depositing films of multicomponent metallic oxides at moderate temperatures.

Moreover, the present method overcomes limitations associated with prior art methods for depositing barium-containing multicomponent metallic oxides onto a zirconia support wherein barium zirconate is typically formed at the elevated reaction temperatures of greater than about 950° C. required to deposit the film. Barium zirconate formation has been eliminated because the present OMCVD method is conducted at temperatures substantially lower than 950° C.

The claimed method can also produce sub-micron crystallites under the conditions employed which readily sinter at low temperatures, ca. 800° C. Therefore, residual through-porosity in the OMCVD multi-component metallic oxide layer can be eliminated to the extent desired by heat treatment at unexpectedly low temperatures such that the support structure is not adversely affected. Such temperatures are substantially below those reported in the literature for the liquid suspension spray deposition technique (1400° C.) wherein extensive sintering of the porous support structure would be expected.

The following examples are provided to further illustrate Applicants' method for making the inorganic membranes of the present invention. The examples are illustrative and are not intended to limit the scope of the appended claims.

EXAMPLE 1

Preparation of Lanthanum-tris (2,2,6,6-Tetramethyl-3,5-Heptanedionate) $La(thd)_3$ $La(thd)_3$ was purchased from Strem Company, Newburyport, Mass. The material was initially sublimed at 120° C. under vacuum. The material was then sublimed at 250° C. to 260° C. and yielded a pure material which showed no apparent decomposition at 200° C. under vacuum conditions.

EXAMPLE 2

Preparation of Strontium-bis(2,2,6,6-Tetramethyl-3,5-Heptanedionate) $Sr(thd)_2$ $Sr(thd)_2$ was purchased from Strem Company, Newburyport, Mass. The material was initially sublimed at 120° C. under vacuum and provided a small amount of yellow oil on the cold finger. The material was then sublimed at 250° C. to 260° C. and yielded a pure material which showed no apparent decomposition at 200° C. under vacuum conditions.

EXAMPLE 3

Preparation of
[Barium-bis(2,2,6,6-Tetramethyl-3,5-Heptanedionate)]$_4$
(Ba)$_4$(thd.)$_8$ The following generic synthetic method was used to prepare (Ba)$_4$(thd)$_8$. 2,2,6,6-tetramethyl-3,5-heptanedione (0.5 moles) was slowly added to barium hydride (0.25 moles) as a stirred slurry in 300 ml of tetrahydrofuran (THF) under a vented atmosphere of nitrogen gas. Hydrogen gas evolution was observed. The reaction mixture was gently warmed to an overnight reflux after the bubbling caused by gas evolution had subsided. Solid impurities were filtered from the solution after the mixture had cooled. THF was stripped from the clear filtrate by applying a vacuum initially at room temperatures and then by slowly heating the solution to a maximum of 150° C. until no further volatiles emerged from the crude product. The crude product was sublimed one or more consecutive times at 50 torr at 230°–250° C. The average yield obtained during each synthesis was 80%. Elemental microanalysis conducted on four different samples provided the following range of percentages:

Found: C 52.16–52.49%; H 7.70–7.76%,
Calculated: C 52.44%; H 7.54%; Ba 27.26%

The above-mentioned elemental analyses were in agreement with the theoretical values. The barium concentration was determined by ICPAA (inductively coupled plasma atomic absorption) analysis and found to be 28.0±0.2% Ba (at the 95% confidence interval with three replicates) in close agreement with the theoretical value.

EXAMPLE 4

Preparation of
Cobalt-bis(2,2,6,6-Tetramethyl-3,5-Heptanedionate)
Co(thd)$_2$

Co(thd)$_2$ was prepared on a 0.0940 mol scale by adding 17.3 g of 2,2,6,6-tetramethyl-3,5-heptanedione (obtained from Aldrich Chem. Co., Milwaukee, Wis.) to cobalt acetate in aqueous methanol. The resulting solution was neutralized to a pH of 8 with ammonium hydroxide to provide a pink slurry. Following sublimation under vacuum, a volatile white powder was removed from the complex, the powder being identified as ammonium acetate. The material was extracted with a water/ether solution to remove ammonium acetate. A series of sublimations at 150° C. under vacuum provided a 54% yield of the ruby-red crystalline solid product.

EXAMPLE 5

Preparation of
Iron-tris(2,2,6,6-Tetramethyl-3,5-Heptanedionate)
Fe(thd)$_3$

Fe(thd)$_3$ was prepared on a 0.181 mol scale by adding 3 eq mol of 2,2,6,6-tetramethyl-3,5-heptanedione to FeCl$_3$·6H$_2$O dissolved in water. Excess sodium acetate (0.0724 mol) was added to the FeCl$_3$·6H$_2$O solution as a buffer. The resulting orange emulsion was treated with ammonium hydroxide to adjust the pH to 10 providing a slurry of the same color. The crude product was purified by sublimation under vacuum at 150° C. A dark orange crystalline solid was obtained in 43% yield.

EXAMPLE 6

Preparation of La$_{0.6}$Ba$_{0.4}$Co$_{0.75}$Fe$_{0.25}$O$_{3-z}$ Thin Film on a Porous Yttria-Stabilized Zirconia Support The organometallic complexes Fe(thd)$_3$, La(thd)$_3$, Co(thd)$_2$, and (Ba)$_4$(thd)$_8$, prepared by the procedures according to Examples 1 through 5 were individually heated to 140° C., 190° C., 120° C., and 220° C. respectively. Organometallic vapor of each complex was individually transported to the reactor in an inert carrier gas of nitrogen at carrier gas flow rates of 1.4 sccm, 24.0 sccm, 2.3 sccm and 28.5 sccm respectively for Fe(thd)$_3$, La(thd)$_3$, Co(thd)$_2$ and (Ba)$_4$(thd)$_8$ sources. The porous substrate was a 1.9 cm section of 1.2 cm O.D. porous yttria stabilized zirconia (YSZ) tube (Kyocera Corporation, Japan). The substrate had pores of ca. 0.8 μm diameter and possessed 32% porosity by volume. Deposition on the outer surface of the tube was performed at a temperature of 650° C. for about 3.5 hours followed by cooling of the film at 100° C. hr$^{-1}$ in a stream of oxygen/nitrogen at 2 torr. The total flow rate to the reactor was 106 sccm with a oxygen flow rate of 40 sccm.

The resulting inorganic membrane was analyzed by scanning electron microscopy (SEM) and demonstrated a smooth top layer with no cracking of the multicomponent metallic oxide layer. A fractured cross-section revealed a uniform coating ca. 4–8 μm thick. The film showed good adhesion to the substrate. Energy Dispersive Spectroscopy (EDS) analysis of the sample confirmed the presence of La, Ba, Co, and Fe. Ion coupled plasma (ICP) analysis of the deposited layer (average of two separately analyzed sections) indicated metal molar ratios of La:Ba 1:0.67, Fe:Co 1:2.9, and (A site:B site) ratio of 1:0.96 according to the perovskite structure ABO$_3$. X-ray diffraction analysis indicated that the major phase was a cubic perovskite with a lattice parameter of a=3.97. In addition, there was a second minor cubic phase with a lattice parameter a=3.89. Only a single minor peak at a d-spacing of 2.42 remained unassigned. Therefore, the sample composition was La$_{0.6}$Ba$_{0.4}$Co$_{0.75}$Fe$_{0.25}$O$_{3-z}$.

EXAMPLE 7

Preparation of La$_{0.1}$Ba$_{0.9}$Co$_{0.9}$Fe$_{0.1}$O$_{3-z}$ Thin Film on a Porous Yttria-Stabilized Zirconia Support Organometallic complexes, Co(thd)$_2$ and (Ba)$_4$(thd)$_8$, prepared according to the above-mentioned Examples, and samples of La(thd)$_3$ and Fe(thd)$_3$, supplied by Epichem Co., United Kingdom, were individually heated at temperatures of 120° C., 185° C., 120° C., and 220° C., and transferred into a chemical vapor deposition reactor using nitrogen carrier gas flow rates of 5.0. 10.0, 4.4 and 35.0 sccm respectively for Fe(thd)$_3$, La(thd)$_3$, Co(thd)$_2$, and (Ba)$_4$(thd)$_8$.

A 1.7 cm section of a porous yttria stabilized zirconia tube similar to that described in EXAMPLE 6 was used as the substrate. Deposition was performed at a temperature of 550° C. for about 3.0 hours followed by cooling of the resulting multicomponent metallic oxide film at 100° C. hr$^{-1}$ in a stream of oxygen/nitrogen at 2 Torr. The total flow rate to the reactor was 105 sccm with a oxygen flow of 40 sccm.

The deposited multicomponent metallic oxide film possessed a cubic perovskite XRD pattern and demonstrated intense peaks corresponding to the [110], [211], and [220] lines. The lattice parameter was a=4.00. A very weak peak at a d spacing of 2.45, indicative of a second impurity phase, was assigned to $Co_3O_4$ or $Fe_3O_4$. ICP analysis of the deposited oxide layer indicated metal molar ratios of: La:Ba 1:7.3, Fe:Co 1:6.5, and (A site:B site ratio) of 1:1.08. Therefore, the deposited layer composition was $La_{0.1}Ba_{0.9}Co_{0.9}Fe_{0.1}O_{3-z}$.

EXAMPLE 8

Preparation of (La,Ba)(Co,Fe)$O_{3-z}$ Thin Film on a Porous Yttria-Stabilized Zirconia Support The procedure described in EXAMPLE 6 was repeated with deposition at 550° C. for 3 hours onto a section of porous YSZ tube, except the Fe(thd)$_3$, La(thd)$_3$, Co(thd)$_2$, and (Ba)$_4$(thd)$_8$ source carrier gas flow rates were adjusted to 2.5, 20, 3.1, and 35 sccm respectively. The total flow rate to the reactor was 110 sccm. EDS analysis of the sample confirmed the presence of La, Ba, Co, and Fe. The XRD pattern indicated a cubic perovskite phase and a lattice parameter of a=3.99 for the deposited film. Following annealing at 700° C. for 2 hours in air (5° C. min$^{-1}$ heating and cooling rates), the XRD pattern remained substantially identical to the standard with a lattice parameter of a=3.99. Following further annealing at 800° C. in air for 2 hours (5° C. min$^{-1}$ heating and cooling rates), the XRD pattern was essentially unchanged with a lattice parameter a=3.98.

A minor peak at a d-spacing of 2.44 for the as deposited and 700° heat-treated multicomponent metallic oxide film and at 2.43 for the film following heat-treatment at 800° C. was assigned to an impurity $Co_3O_4$ or $Fe_3O_4$ phase. Therefore, XRD demonstrated that a single phase crystalline multicomponent metallic oxide was obtained and was unaffected by the heat treatment steps.

EXAMPLE 9

Preparation of $La_{0.2}Ba_{0.8}Co_{0.8}Fe_{0.2}O_{3-z}$ Thin Film on a Porous Calcia Stabilized Zirconia Support The procedure described in EXAMPLE 6 was repeated using a porous calcia (~5 wt.%) stabilized zirconia (CSZ) substrate disc as substrate (ca. 1.5 mm thick and 20 mm diameter machined from ceramic pieces obtained from Johnson Matthey), and Fe(thd)$_3$, La(thd)$_3$, Co(thd)$_2$, and (Ba)$_4$(thd)$_8$ as complexes using source carrier gas flow rates of 2.4, 18, 3.1, and 35 sccm respectively. The reaction was conducted at 550° C. The multicomponent metallic oxide coating was applied in two separate 3 hour deposition periods. XRD analysis of the deposited film showed a cubic perovskite XRD pattern with a lattice parameter of a=3.98. An additional weak peak was present at a d-spacing of 2.43 which was assigned to $Co_3O_4$ or $Fe_3O_4$.

Following XRD analysis, the film was annealed in air at 840° C. for four days (1° C. min$^{-1}$ heating and cooling rates), and the XRD pattern was recorded. The cubic phase still dominated the XRD spectrum, again with a lattice parameter a=3.98. In addition, a second minor cubic phase of lattice spacing a=3.91 also developed during the heat-treatment process and additional other unassigned phases. SEM study of the deposited layer also showed that the film had undergone sintering. The film had cracked as a result of the heat treatment due to thermal mismatch between the substrate and the deposited layer. ICP analysis of the deposited film provided metal molar ratios of: La:Ba 1:4.8, Fe:Co 1:4.1, and A site:B site 1:1.05. Therefore, the layer composition was $La_{0.2}Ba_{0.8}Co_{0.8}Fe_{0.2}O_{3-z}$.

EXAMPLE 10

Preparation of(La,Ba)(Co,Fe)$O_{3-z}$ Thin Film on a Porous Yttria-Stabilized Zirconia Support The procedure described in EXAMPLE 6 was repeated using a section of porous YSZ tube except the Fe(thd)$_3$, La(thd)$_3$, Co(thd)$_2$, and (Ba)$_4$(thd)$_8$ source carrier gas flow rates were adjusted to 2.4, 15, 3.1, and 30 sccm respectively. EDS analysis of the sample confirmed the presence of La, Ba, Co, and Fe. The coating had a cubic perovskite XRD pattern with a lattice parameter of a=3.98. Additional weak peaks at d spacings of 3.10, 1.52 and 2.45, were indicative of impurity phases.

EXAMPLE 11

Preparation of (La,Ba)(Co,Fe)$O_{3-z}$ Thin Film on a Multicomponent Metallic Oxide Support The procedure described in EXAMPLE 6 was repeated using a porous $La_{0.20}Sr_{0.80}Co_{0.80}Fe_{0.20}O_{3-z}$ disc as substrate (ca. 1 mm thick and 20 mm O.D.), and Fe(thd)$_3$, La(thd)$_3$, Co(thd)$_2$, and (Ba)$_4$(thd)$_8$ as complexes at source carrier gas flow rates of 2.4, 20, 3.1, and 25 sccm respectively. The ITM coating was applied in two separate 3 hour deposition periods at 550° C. A cross-section of the multicomponent metallic oxide coating was examined by SEM following deposition which showed a ca. 8 μm film as demonstrated in the Figure. The sample was heat treated in two sections to promote densification, one at 850° C. for 2 hours and one section at 950° C. for ½ hour using heating and cooling rates of 2° C. min$^{-1}$. The heat treatment at 950° C. produced extensive sintering and densification of the film and some sintering of the support. Sintering at a temperature of 850° C. had negligible effect on the support structure but the film was sintered. Both heat treated samples continued to show excellent adhesion to the $La_{0.20}Sr_{0.80}Co_{0.80}Fe_{0.20}O_{3-z}$ support and microcracking was not produced by the heat treatment due to compatible thermal expansion coefficients of the mixed oxide layer and the porous support.

EXAMPLE 12

Separation of Oxygen from an Oxygen-Containing Mixture Using the Inorganic Membranes of the Present Invention The inorganic membranes of the present invention can be operated to separate oxygen from oxygen-containing gaseous mixtures utilizing known apparatus such as that disclosed in U.S. Pat. No. 5,035,727, issued to Air Products and Chemicals, Inc., Allentown, Pa., the Specification and Claims which are specifically incorporated by reference herein and made a part of this application. The following general example is provided.

Oxygen may be selectively separated from an oxygen-containing gaseous mixture using the membranes of the present invention by providing two gaseous atmospheres having a difference in oxygen partial pressure through the membrane and heating the membrane to a temperature sufficient for the solid electrolyte to exhibit oxide ion conductivity whereby oxygen in a gaseous atmosphere having a higher oxygen pressure migrates electrochemically through the membrane toward the other gaseous atmosphere having a low oxygen pressure and is thus separated and received in the latter. The rate of permeation is determined not only by the rate of diffusion within the membrane but also by the interfacial kinetics of oxygen exchange, i.e., the speed at which oxygen molecules in the feed gas are converted to mobile atomic oxygen ions in the solid phase and the speed at which these ions are converted back to oxygen molecules in the permeate gas.

The temperature at which each specific inorganic membrane will exhibit oxide ion conductivity and electron conductivity will differ depending upon the types and proportions of the metal oxides constituting the multicomponent metallic oxide. Heating should be performed at a temperature ranging from at least 400° C., and preferably from 600° C. to 1000° C. The method according to the present invention can be practiced by forming two gaseous atmospheres having a difference in the partial pressure of oxygen. For example, the two gaseous atmospheres may be provided by a method which comprises partitioning two communicating chambers gas-tight by the aforesaid membrane and exposing one of the chambers to an oxygen-containing gaseous mixture at atmospheric pressure while reducing the pressure of the other chamber. Alternately, the oxygen-containing gaseous mixture, at pressure, may be supplied to one of the chambers while the other is maintained at atmospheric or reduced pressure. Accordingly, only oxygen selectively permeates electrochemically through the membrane and oxygen gas having a high purity can be obtained in the chamber having a lower oxygen partial pressure.

The method according to the present invention provides numerous advantages over prior art processes for manufacturing inorganic membranes. The OMCVD method produces uniform and conformal layers enabling complex support structures to be coated. Moreover, direct low temperature deposition promotes low stress coatings and minimizes chemical reactions and microstructural changes in the substrate compared to high temperature routes such as electrochemical vapor deposition. OMCVD also produces crystallites, which readily densify at low temperatures, ca. 800° C., enabling densification of the deposited layer at low temperatures.

Having thus described the present invention, what is now deemed appropriate for Letters Patent is set forth in the following Claims.

We claim:

1. A method for manufacturing an inorganic membrane comprising a layer of an oxide ion conducting multicomponent metallic oxide which has been deposited onto a porous substrate, the method consisting essentially of:
   (a) individually heating organometallic complexes capable of forming an oxide ion conducting multicomponent metallic oxide comprising at least two different metal to a temperature sufficient to vaporize the organometallic complexes, each organometallic complex comprising organic functionality and a metallic component corresponding to a metal in the multicomponent metallic oxide;
   (b) introducing the vaporous organometallic complexes and an oxidizing agent into a reactor containing a porous substrate to form a mixture of the vaporous organometallic complexes and the oxidizing agent; and
   (c) depositing a layer of the oxide ion conducting multicomponent metallic oxide onto the porous substrate by reacting the mixture of organometallic complexes and oxidizing agent at a temperature of about 400° C. to 800° C. and pressure ranging from 1 to 760 torr to form the inorganic membrane.

2. The method according to claim 1 which further comprises:
   (d) heat treating the layer of multicomponent metallic oxide at a temperature ranging from 650° C. to 1100° C. for a period ranging from 10 minutes to five hours.

3. The method according to claim 1 wherein the porous substrate is selected from the group consisting of alumina, silica, magnesia, titania, a high temperature oxygen compatible metal alloy, a metal oxide stabilized zirconia, and compounds and mixtures thereof.

4. The method according to claim 1 wherein the porous substrate comprises a multicomponent metallic oxide.

5. The method according to claim 4 wherein the oxidizing agent is selected frown the group consisting of oxygen, air, ozone, $N_2O$ and a mixture of water and oxygen.

6. A method for manufacturing an inorganic membrane comprising a layer of a mixed conducting multicomponent metallic oxide containing a Group 2 metal which is deposited onto a porous substrate, the method consisting essentially of:
   (a) individually heating organometallic complexes capable of depositing a mixed conducting multicomponent metallic oxide comprising at least two different metals wherein one of the metals comprises a Group 2 metal to a temperature sufficient to vaporize the organometallic complexes, each organometallic complex comprising organic functionality and a metallic component corresponding to a metal in the multicomponent metallic oxide;
   (b) introducing the vaporous organometallic complexes and an oxidizing agent into a reactor containing a porous substrate to form a mixture of the vaporous organometallic complexes and the oxidizing agent; and
   (c) depositing a layer of the mixed conducting multicomponent metallic oxide containing the Group 2 metal onto the porous substrate by reacting the mixture of organometallic complexes and oxidizing agent at a temperature of about 400° C. to 800° C. and pressure ranging from 1 to 760 torr to form the inorganic membrane.

7. The method according to claim 6 which further comprises:
   (d) heat treating the layer of multicomponent metallic oxide containing the Group 2 metal at a temperature ranging from 650° C. to 1100° C. for a period ranging from 10 minutes to five hours.

8. The method according to claim 6 wherein the porous substrate is selected from the group consisting of alumina, silica, magnesia, titania, a high temperature oxygen compatible metal alloy, a metal oxide stabilized zirconia and compounds and mixtures thereof.

9. The method according to claim 6 wherein the porous substrate comprises a multicomponent metallic oxide.

10. The method according to claim 9 wherein the oxidizing agent is selected from the group consisting of oxygen, air, ozone, $N_2O$ and a mixture of water and oxygen.

11. The method according to claim 10 wherein the multicomponent metallic oxide layer contains a Group 2 metal selected from the group consisting of calcium, strontium, barium and magnesium.

* * * * *

UNITED STATES PATENT AND TRADEMARK OFFICE
CERTIFICATE OF CORRECTION

PATENT NO.   : 5,439,706

DATED        : August 8, 1995

INVENTOR(S)  : Robin E. Richards, et al.

It is certified that error appears in the above-identified patent and that said Letters Patent is hereby corrected as shown below:

Column 3, Line 19
    Delete subscript "40" and substitute therefor -- y --

Column 3, Line 23
    Delete "Fable" and substitute therefor -- Table --

Column 3, Line 24
    Delete "$0 \leq x' \leq, 1,$ and substitute therefor -- "$0 \leq x' \leq 1,$ --

Column 3, Line 43
    Delete "densities" and substitute therefor -- densifies --

Column 14, Line 18
    Delete "frown" and substitute therefor -- from --

Signed and Sealed this

Third Day of September, 1996

*Attest:*

BRUCE LEHMAN

*Attesting Officer*         *Commissioner of Patents and Trademarks*